United States Patent
Okabe et al.

(10) Patent No.: US 8,094,268 B2
(45) Date of Patent: Jan. 10, 2012

(54) LIQUID CRYSTAL DISPLAY SUBSTRATE, LIQUID CRYSTAL DISPLAY DEVICE AND MANUFACTURING METHOD OF THE LIQUID CRYSTAL DISPLAY SUBSTRATE

(75) Inventors: Tohru Okabe, Nara (JP); Yoshimasa Chikama, Kyoto (JP)

(73) Assignee: Sharp Kabushiki Kaisha, Osaka (JP)

( * ) Notice: Subject to any disclaimer, the term of this patent is extended or adjusted under 35 U.S.C. 154(b) by 162 days.

(21) Appl. No.: 11/915,881

(22) PCT Filed: Jul. 12, 2006

(86) PCT No.: PCT/JP2006/313902
§ 371 (c)(1),
(2), (4) Date: Nov. 29, 2007

(87) PCT Pub. No.: WO2007/007808
PCT Pub. Date: Jan. 18, 2007

(65) Prior Publication Data
US 2009/0279026 A1      Nov. 12, 2009

(30) Foreign Application Priority Data

Jul. 13, 2005   (JP) .................................. 2005-204676

(51) Int. Cl.
G02F 1/1335        (2006.01)
(52) U.S. Cl. ...................................... 349/114
(58) Field of Classification Search ............ 349/114
See application file for complete search history.

(56) References Cited

U.S. PATENT DOCUMENTS

| | | | |
|---|---|---|---|
| 5,818,550 A | 10/1998 | Kadota et al. | |
| 6,788,367 B2 * | 9/2004 | Chang et al. | 349/114 |
| 6,831,718 B2 | 12/2004 | Wei et al. | |
| 7,084,940 B2 | 8/2006 | Nimura et al. | |
| 7,115,913 B2 | 10/2006 | Shigeno | |
| 7,119,863 B2 | 10/2006 | Seki et al. | |
| 2005/0030451 A1* | 2/2005 | Liu | 349/113 |
| 2005/0083459 A1* | 4/2005 | Ukawa et al. | 349/114 |
| 2005/0174511 A1 | 8/2005 | Sugawara et al. | |

FOREIGN PATENT DOCUMENTS

| | | |
|---|---|---|
| JP | 2003-270430 | 9/2003 |
| JP | 2004-4680 | 1/2004 |
| JP | 2004-53867 | 2/2004 |
| JP | 2004-77544 | 3/2004 |

OTHER PUBLICATIONS

International Search Report for PCT/JP2006/313902 mailed Aug. 22, 2006.

* cited by examiner

Primary Examiner — Jerry Rahll
(74) Attorney, Agent, or Firm — Nixon & Vanderhye P.C.

(57) ABSTRACT

[MEANS FOR SOLVING THE PROBLEMS] A liquid crystal display substrate includes an insulating substrate 10, an interlayer insulating film 11 formed on the insulating substrate 10, an interlayer insulating film 11a in a transmitting portion T, a reflecting metal film 12 formed on an interlayer insulating film 11b in a reflecting portion R, and a color filter 13 formed on the interlayer insulating film 11a and the reflecting metal film 12. The interlayer insulating film 11b in the reflecting portion R has a corrugated surface formed by concave portions and convex portions. A height h1 of the interlayer insulating film 11a in the transmitting portion T is equal to or lower than a height h2 of the convex portion. The liquid crystal display substrate further includes a transparent dielectric layer 14 on the color filter 13 formed in the reflecting portion R.

[SELECTED FIGURE]

15 Claims, 6 Drawing Sheets

LIQUID CRYSTAL DISPLAY SUBSTRATE, LIQUID CRYSTAL DISPLAY DEVICE AND MANUFACTURING METHOD OF THE LIQUID CRYSTAL DISPLAY SUBSTRATE

This application is the U.S. national phase of International Application No. PCT/JP2006/313902 filed 12 Jul. 2006 which designated the U.S. and claims priority to Japanese Application No. 2005-204676 filed 13 Jul. 2005, the entire contents of each of which are hereby incorporated by reference.

TECHNICAL FIELD

The invention relates to a liquid crystal display substrate that is used in a reflective-transmissive type liquid crystal display device capable of providing display both in a transmissive mode and a reflective mode.

BACKGROUND ART

Recently, mobile equipments such as a cellular phone and a PDA (Personal Digital Assistance) have been used for various purposes at various locations, and new products have been developed one after another. A reflective-transmissive type liquid crystal display (hereinafter, referred to as "transflective liquid crystal display") is an example of a liquid crystal display that is often used in these equipments. The transflective liquid crystal display has capabilities of both a reflective type display that uses reflection of strong ambient light such as sunlight from a reflector and a transmissive type display that uses transmitted light from an illumination device such as a backlight. The transflective liquid crystal display can be used at various locations. Therefore, technology of the transflective liquid crystal display has been actively developed and various technologies and ideas have been applied to display panels.

FIG. 13 is a schematic cross-sectional view of a currently widely used transflective liquid crystal display. As shown in FIG. 13, in the transflective liquid crystal display, a transparent electrode 101 for a transmitting portion for transmitting light 301 from an internal backlight therethrough and a reflector 102 for reflecting external light 302 are provided in a single pixel. The reflector 102 is produced by forming an electrically conductive metal having a high reflectance such as Al and Ag on an interlayer insulating film 103 having a finely corrugated profile, and is used as an electrode for a reflective portion. The corrugated profile of the reflector 102 is precisely designed with photolithography technology or the like so that the reflector 102 efficiently reflects incident light 302 and improved brightness and improved reflection display characteristics are obtained.

In the transflective display, an optical path length of the light 302 reflected from the reflector 102 in the reflecting portion is different from that of the internal light 301 in the transmitting portion. Therefore, various techniques are required to obtain equal display capability both in the reflecting portion and the transmitting portion. In particular, since color design is a very important display property. Since light 302 passes through the color filter 201 twice in a reflection display mode, color adjustment between the transmitting portion and the reflecting portion is implemented by making the color purity of a color filter 201 in the reflecting portion smaller than that of a color filter 202 in the transmitting portion, changing the color filter thickness between the reflecting portion and the transmitting portion, and the like.

High quality screen has been increasingly demanded not only for large screen displays but for small screen displays used for mobile equipments, and very high definition displays of more than 200 ppi (pixel per inch) have been developed for mobile equipments. However, since higher definition displays have a smaller pixel size, a large margin for misalignment needs to be set in the manufacturing process, which reduces an aperture ratio (a ratio of display size to pixel size). In a liquid crystal display element, large misalignment is caused in the process of bonding a thin film transistor (TFT) substrate and a counter substrate having a color filter to each other. This large misalignment has been a problem in manufacturing a high definition display. Therefore, so-called CF on TFT technology, a technology of forming a color filter (CF) directly on a TFT substrate, has been developed instead of the currently used method of forming a color filter on a counter substrate (for example, see Patent document 1).

Recently, a lightweight, flexible plastic substrate has attracted attention for use in next-generation displays. A plastic substrate changes in dimensions significantly by temperature and water compared to a glass substrate. Therefore, the CF on TFT technology that does not cause misalignment in the bonding process is an especially promising method for manufacturing a flexible display using a plastic substrate.

Patent document 1: Japanese Patent Laid-Open Publication No. 8-122824

DISCLOSURE OF THE INVENTION

Problems to be Solved by the Invention

However, when the CF on TFT technology is used for the TFT substrate of FIG. 13, a big problem is caused in color filter control. More specifically, the TFT substrate of FIG. 13 has a large recess with a depth of about 3 μm in the transmitting portion. Therefore, when a color filter is applied to the transmitting portion by a spin coating method or the like, the color filter is deposited in the recess. In other words, the thickness of the color filter in the transmitting portion is significantly different from that of the color filter in the reflecting portion. Since the area of the transmitting portion and the size of the recess vary by the model of the device, the need for controlling the recess also varies. Moreover, the influence of the recess also varies depending on the viscosity of a color filter material. Therefore, especially in the transflective display, color filter control in the reflecting portion and the transmitting portion greatly affect display capability, making the problem caused by the recess more serious.

The recess causes a problem not only in application of the color filter but in application of an alignment film and an electrically conductive film. In other words, the recess causes a non-uniform film thickness and formation of liquid pool. Moreover, in a rubbing process for rubbing an alignment film with cloth in a fixed direction in order to orient liquid crystal molecules, the recess may cause defective rubbing, resulting in non-uniform alignment or the like.

In addition, in the transflective liquid crystal display of FIG. 13, the color filter 201 and the color filter 202 respectively corresponding to the reflecting portion and the transmitting portion need to be precisely aligned. However, misalignment of several micrometers occurs in the actual bonding process, resulting in reduction in color purity at the boundary or reduction in an aperture ratio.

Means for Solving the Problems

It is an object of the invention to facilitate color adjustment between a transmitting portion and a reflecting portion while maintaining excellent reflection characteristics in a color liquid crystal display substrate having a plurality of pixels having a transmitting portion and a reflecting portion and to provide a high aperture ratio, high definition display.

A liquid crystal display substrate according to the invention has a plurality of pixels having a transmitting portion and a reflecting portion. The liquid crystal display substrate of the invention includes: an insulating substrate; an insulating film formed on the insulating substrate; an electrode for the transmitting portion formed on the insulating film in the transmitting portion; an electrode for the reflecting portion formed on the insulating film in the reflecting portion; and a color filter formed on the transmitting portion electrode and the reflecting portion electrode. The insulating film in the reflecting portion has a corrugated surface formed by concave portions and convex portions. A height of the insulating film in the transmitting portion is equal to or lower than a height of the convex portion of the insulating film.

EFFECT OF THE INVENTION

The invention provides a high aperture ratio, high definition display that enables easy implementation of color adjustment between a transmitting portion and a reflecting portion while maintaining excellent reflection characteristics.

DESCRIPTION OF THE REFERENCE NUMERALS

Figure 1:
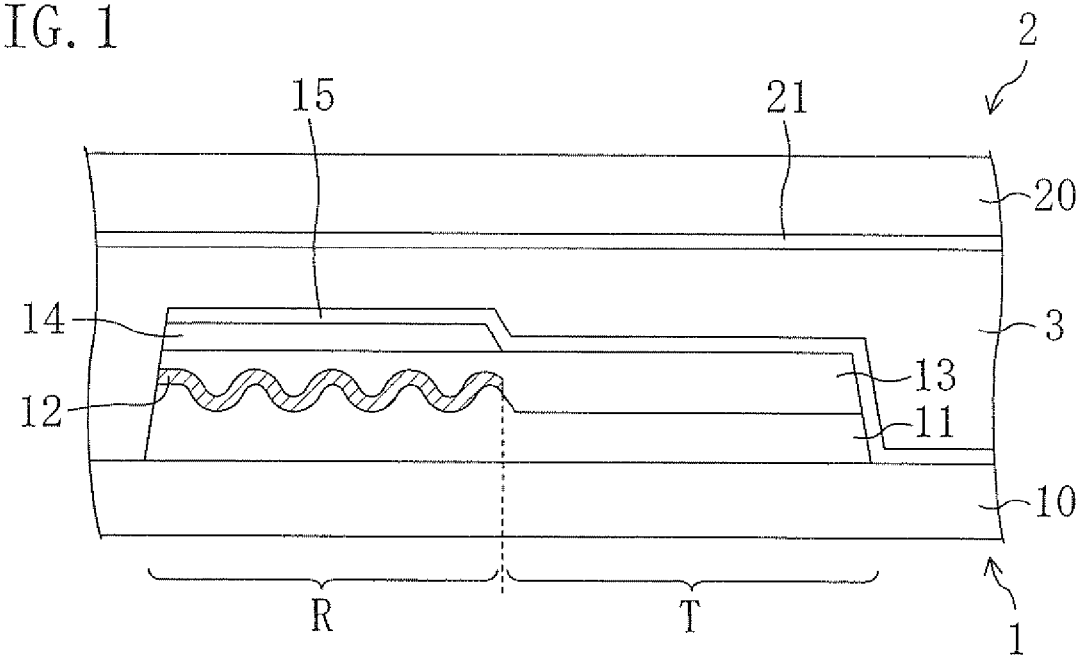
FIG. 1 is a schematic cross-sectional view of a liquid crystal display device according to a first embodiment.

1 TFT substrate
2 counter substrate
3 liquid crystal layer
10 insulating substrate
11 interlayer insulating film
12 reflecting metal film
13 color filter
14 transparent dielectric layer
20 insulating substrate
21 counter electrode
41 mask pattern
42 half-tone exposure pattern
T transmitting portion
R reflecting portion
h1 height of the interlayer insulating film 11 in the transmitting portion T
h2 height of a convex portion in the reflecting portion R
h3 height of a concave portion in the reflecting portion R

BEST MODE FOR CARRYING OUT THE INVENTION

Hereinafter, embodiments of the invention will be described with reference to the accompanying drawings. In the following embodiments, a TFT (thin film transistor) liquid crystal display device will be described as an example of the invention. Similar elements designated by reference numerals with an alphabetic letter attached thereto are sometimes generally referred to by a reference numeral without an alphabetic letter. For example, an interlayer insulating film 11a in a transmitting portion T and an interlayer insulating film 11b in a reflecting portion R are sometimes generally referred to as an interlayer insulating film 11.

First Embodiment

FIG. 1 is a schematic cross-sectional view of a liquid crystal display device according to a first embodiment. The liquid crystal display device of this embodiment includes a TFT substrate 1, a counter substrate 2 facing the TFT substrate 1, and a liquid crystal layer 3 interposed between the TFT substrate 1 and the counter substrate 2. The liquid crystal display device of this embodiment has a plurality of pixels arranged in a matrix.

At least one of the plurality of pixels has a transmitting portion T and a reflecting portion R. The transmitting portion T provides transmissive mode display by using light entering from the side of the TFT substrate 1. The reflecting portion R provides reflective mode display by using external light entering from the side of the counter substrate 2.

The TFT substrate 1 has pixel electrodes 15 respectively corresponding to the pixels, TFTs (not shown) respectively corresponding to the pixel electrodes, and scanning lines and signal lines (both not shown) electrically connected to the TFTs.

The TFT substrate 1 has an insulating substrate 10 such as a plastic substrate and a glass substrate. The scanning lines, the signal lines, the TFTs, and the like are formed on the insulating substrate 10, and an interlayer insulating film 11 is formed so as to cover the scanning lines, the signal lines, the TFTs, and the like. A reflecting metal film 12 for a reflector is formed on the surface of the interlayer insulating film 11 in the reflecting portion 1R.

A color filter 13 is formed on the interlayer insulating film 11. The color filter 13 typically has red, green, and blue hues. The thickness of the color filter 13 in the transmitting portion T is lager than an average thickness of the color filter 13 in the reflecting portion R. Color tone can thus be adjusted between the reflecting portion R where light passes through the color filter 13 twice and the transmitting portion T where light passes through the color filter 13 once. Moreover, a transparent dielectric layer 14 is formed on the color filter 13 for the reflecting portion R and a transparent electrode 15 is formed thereon. Like the color filter 13, the transparent dielectric layer 14 is used to adjust the thickness of the liquid crystal layer 3 in the transmitting portion T and the reflecting portion R in view of the path difference of light passing through the liquid crystal layer 3, whereby an optical path length in the reflecting portion R matches an optical path length in the transmitting portion T. The transparent electrode 15 is formed from a transparent, electrically conductive material such as ITO (indium tin oxide) and IZO (indium zinc oxide). The transparent electrode 15 is electrically connected to a drain electrode of a TFT through a contact hole formed in the interlayer insulating film 11 and the color filter 13 and functions as a pixel electrode.

The counter substrate 2 has an insulating substrate 20 such as a plastic substrate and a glass substrate. A counter electrode 21 is formed in a region corresponding to the reflecting portion R and a region corresponding to the transmitting portion T on the insulating substrate 20. The counter electrode 21 is formed from a transparent, electrically conductive material such as ITO and has a flat surface regardless of the regions.

Typically, an alignment layer (not shown) of a polymeric material such as polyimide is formed on the respective surfaces of the TFT substrate 1 and the counter substrate 2 which are located on the side of the liquid crystal layer 3. These alignment layers are subjected to a rubbing process. The TFT substrate 1 and the counter substrate 2 are bonded together by a sealant (not shown) such as epoxy resin and a liquid crystal material is introduced between the substrates 1 and 2 as the liquid crystal layer 3.

In this embodiment, the color filter formed on the counter substrate 2 in the conventional technology is accurately formed over the TFT substrate 1 by high precision alignment such as a photolithography process. In addition, the transparent dielectric layer 14 provided to adjust the respective optical path lengths in the transmitting portion T and the reflecting portion R is also accurately formed over the TFT substrate 1 by the same high precision alignment.

The above structure prevents reduction in an aperture ratio resulting from large misalignment in the bonding process. Therefore, a high aperture ratio, high definition display can be manufactured for a liquid crystal display device having a transmitting portion T and a reflecting portion R in a single pixel.

Figure 2:
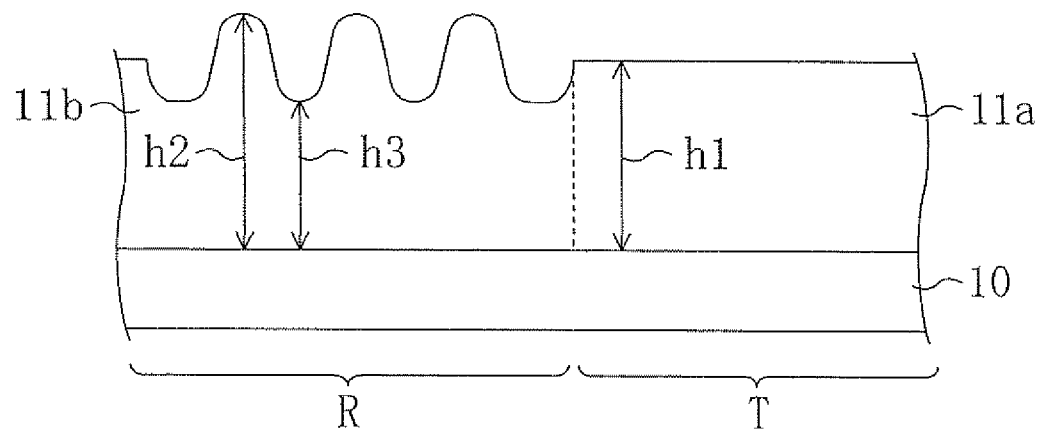
FIG. 2 is an enlarged cross-sectional view of an interlayer insulating film 11 of the first embodiment.

FIG. 2 is an enlarged cross-sectional view of the interlayer insulating film 11 of this embodiment. It should be noted that the reflecting metal film 12 and the color filter 13 are not shown in FIG. 2.

The interlayer insulating film 11 of this embodiment has a flat surface in the transmitting portion T and a corrugated surface having concave portions and convex portions in the reflecting portion R. A height h1 from the substrate surface to the flat surface of the interlayer insulating film 11 in the transmitting portion T is about 3 μm. The height h1 is lower than a height h2 from the substrate surface to the top of a convex portion in the reflecting portion R and is higher than a height h3 from the substrate surface to the bottom of a concave portion in the reflecting portion R.

The difference in level between the top surface in the transmitting portion T and the top of each convex portion in the reflecting portion R can be made approximately equal to the difference in level between the top surface in the transmitting portion T and the bottom of each concave portion in the reflecting portion R. In other words, the height h1 of the interlayer insulating film 11 in the transmitting portion T can be made approximately equal to an average height of the convex portions and the concave portions in the reflecting portion R. Note that the difference in level between the convex portion and the concave portion in the reflecting portion R (h2−h3) is in the range of about 0.5 μm to about 1 μm. The height h1 of the interlayer insulating film 11 in the transmitting portion T may be equal to the height h2 of the convex portion in the reflecting portion R or may be equal to the height h3 of the concave portion in the reflecting portion R.

The interlayer insulating film 11 of this embodiment has a smooth corrugated profile for the reflecting portion R and a flat profile for the transmitting portion T. Therefore, a transflective display device with excellent reflection characteristics can be obtained. In particular, the height h1 of an interlayer insulating film 11a in the transmitting portion T is equal to or lower than the height h2 of the convex portions in the reflecting portion R and equal to or higher than the height h3 of the concave portions in the reflecting portion R. Therefore, the height of the interlayer insulating film 11a in the transmitting portion T can be made approximately equal to the height of an interlayer insulating film 11b in the reflecting portion R. With this structure, a thin film and a coating material can be applied to the interlayer insulating film 11 with approximately the same height in the transmitting portion T and the reflecting portion R. Accordingly, a display device with easy function control can be manufactured.

In the case where the height of the interlayer insulating film 11a in the transmitting portion T is approximately equal to the average height of the convex portions and the concave portions in the reflecting portion R, a thin film and a coating material can be applied to the interlayer insulating film 11 with approximately the same volume in the transmitting portion T and the reflecting portion R. In other words, a display device with easier function control can be manufactured.

In the process of reaching the invention, the inventors obtained new knowledge through the following test. This test will now be described with reference to the accompanying drawings.

Figure 3:
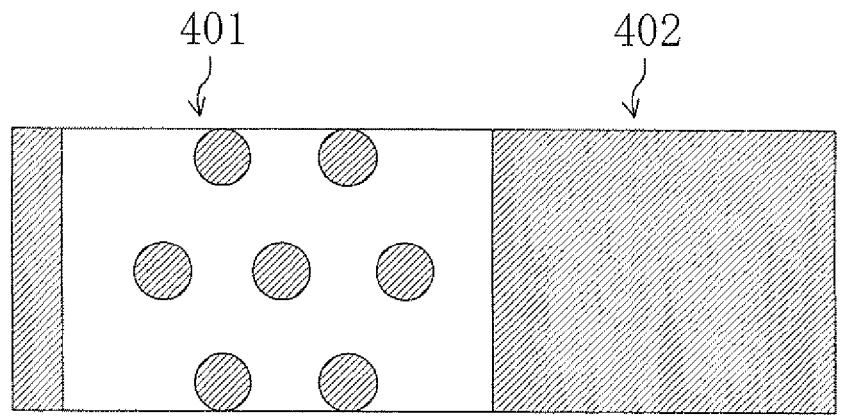
FIG. 3 is a plan view of a pattern corresponding to a single pixel in a photomask used in a test conducted by the inventors.

A highly transparent positive photosensitive resin (e.g., OFRP-800 made by Tokyo Ohka Kogyo Co., Ltd.) was evenly applied with a thickness of 3 μm to the insulating substrate 10 by using a spin coating method (a rotating speed of about 1,500 rpm). A prebake process was then conducted at a relatively low temperature of about 100° C. by using a hot plate, an oven, or the like to evaporate an excessive organic solvent and improve an adhesion property of the resin film. The resin film was then exposed to ultraviolet (UV) rays through a photomask shown in FIG. 3 and a pattern was developed by using a developer (e.g., NMD-3 made by Tokyo Ohka Kogyo Co., Ltd.). The photomask of FIG. 3 has a mask pattern 401 having circular light-shielding portions (with a diameter of about 5 μm) dispersed corresponding to the corrugated pattern in the reflecting portion R and a light-shielding pattern 402 corresponding to the transmitting portion T.

A postbake process was then conducted at a temperature higher than the prebake temperature (e.g., 100 to 200° C.) by using a hot plate, an oven, or the like. As a result, the difference in level between the convex portion and the convex portion in the reflecting portion R was about 0.5 μm and the resin film had a smooth corrugated surface in the reflecting portion R. Since the unexposed transmitting portion T was not developed, the resin film had a flat surface in the transmitting portion T. A metal film having a high reflectance such as Al or Ag was then deposited on the resultant interlayer insulating film by a sputtering method. A photolithography process and an etching process were conducted so that the metal film was left only on the corrugated pattern in the reflecting portion R. A reflector having a smooth corrugated profile was thus completed. A postbake process is a process of causing heat sagging of a resin material by heating so as to change a steep corrugated surface into a smooth corrugated surface. The postbake process is one of the very important processes for the corrugated profile and reflection characteristics of the reflector.

Figure 4:
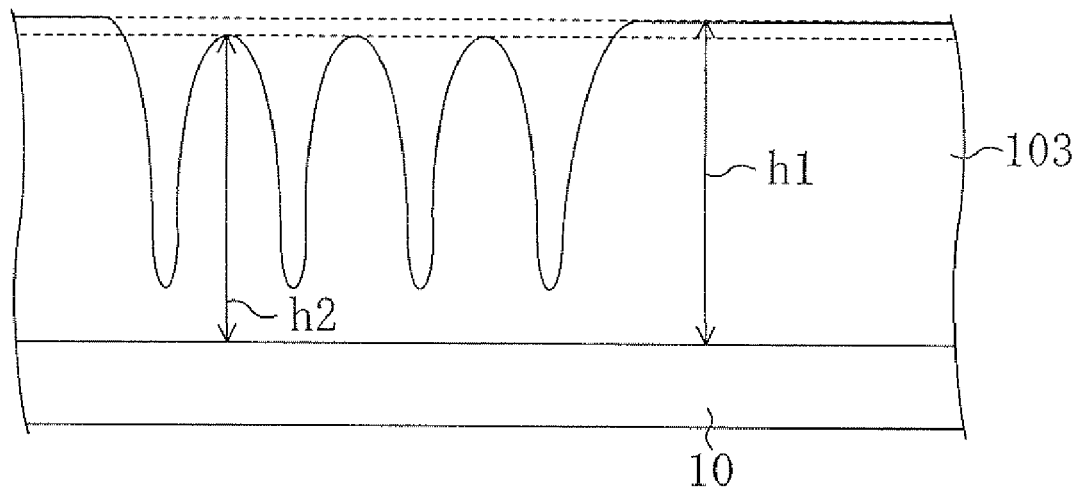
FIG. 4 is a cross-sectional view of a corrugated profile of an interlayer insulating film 103 in the case of insufficient postbake.

Hereinafter, the relation between the postbake conditions and the corrugated profile in the reflecting portion R will be described. FIG. 4 is a cross-sectional view of a corrugated profile of an interlayer insulating film 103 in the case of insufficient postbake. In FIG. 4, due to insufficient heat sagging by the postbake process, the corrugated profile is not so smooth, and is very steep in cross section. Note that there is almost no difference in level between the top of the convex portion and the flat surface of the unexposed transmitting portion T.

Figure 5:
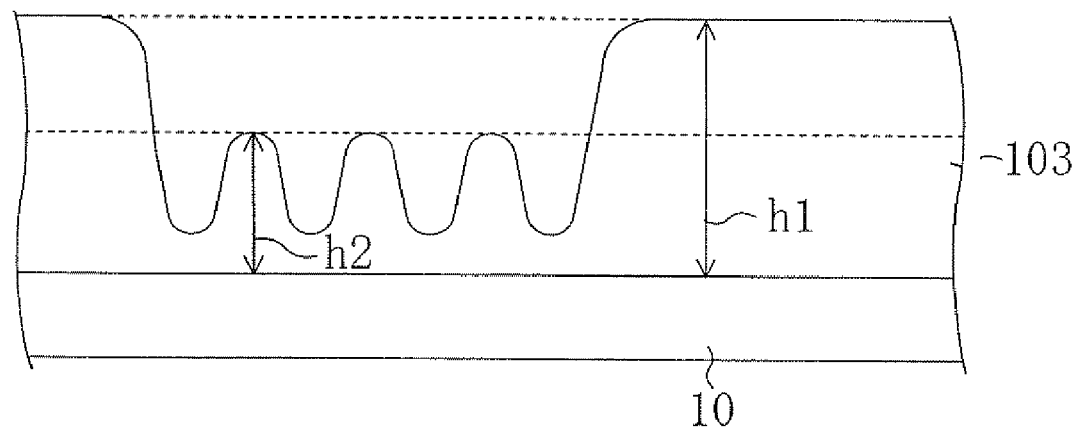
FIG. 5 is a cross-sectional view of a corrugated profile of the interlayer insulating film 103 in the case of sufficient postbake.

FIG. 5 is a cross-sectional view of a corrugated profile of the interlayer insulating film 103 in the case of sufficient postbake. In FIG. 5, because of sufficient heat sagging by the postbake process, a smooth corrugated profile is formed. However, since heat sagging of the convex portions is also used to form a smooth profile, the height of the convex portions is reduced and the difference in level between the top of the convex portion and the flat surface of the unexposed transmitting portion T is increased.

Figure 6:
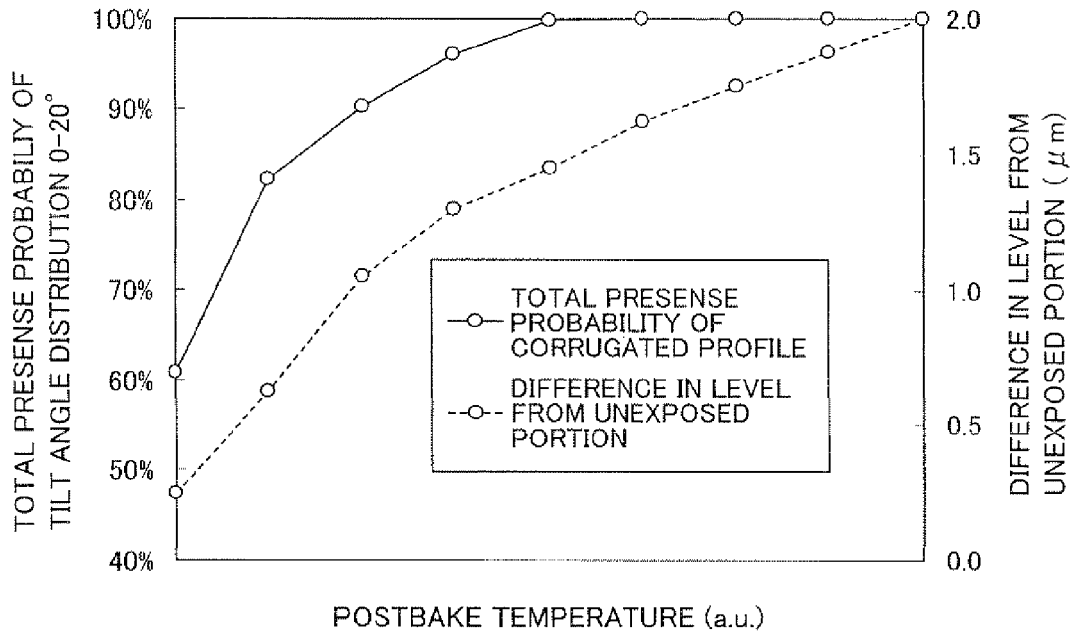
FIG. 6 is a graph showing the relation between a postbake temperature and a corrugated profile in a reflecting portion R.
Figure 7:
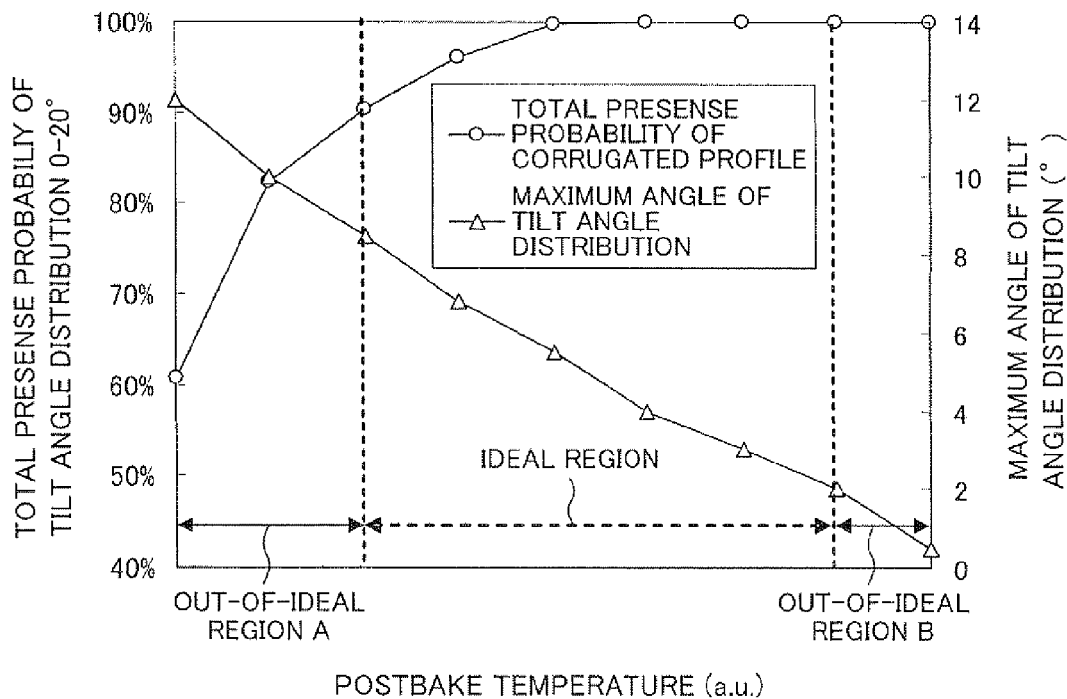
FIG. 7 is a graph showing the relation between a postbake temperature and a maximum value (a maximum angle) of tilt angle distribution in the reflecting portion R.

These results are shown in FIGS. 6 and 7. FIG. 6 is a graph showing the relation between the postbake temperature and the corrugated profile in the reflecting portion R. More specifically, FIG. 6 shows the relation between the postbake temperature and the total probability of presence of the tilt angle of 0° to 20° in the tilt angle distribution of the corrugated profile. FIG. 6 also shows how the difference in level between the top of the convex portion and the unexposed portion changes with a change in the postbake temperature. The presence probability of the tilt angle distribution represents the proportion of the convex and concave portions having each tilt angle. The corrugated profile having a too large tilt angle means that incident light is reflected in a direction significantly away from the incident direction. It is known in the art that incident light can be reflected more efficiently as the probability that the tilt angle of the corrugated profile is present in the tilt angle distribution of 0° to 20° is higher. Preferably, the total presence probability of the tilt angle distribution of 0° to 20° is 90% or higher.

FIG. 7 is a graph showing the relation between the postbake temperature and the maximum value (maximum angle) of the tilt angle distribution in the reflecting portion R. In FIG. 7, a region where the total presence probability of the tilt angle distribution of 0° to 20° is 90% or higher and the maximum value (maximum angle) of the tilt angle distribution is about 2° or more is indicated as an ideal region. However, the ideal region varies somewhat depending on a material to be used or the like. It is generally desirable that the total presence probability of the tilt angle distribution of 0° to 20° is 90% or higher and that the maximum value of the tilt angle distribution is in the range of 2° to 10°.

Figure 8:
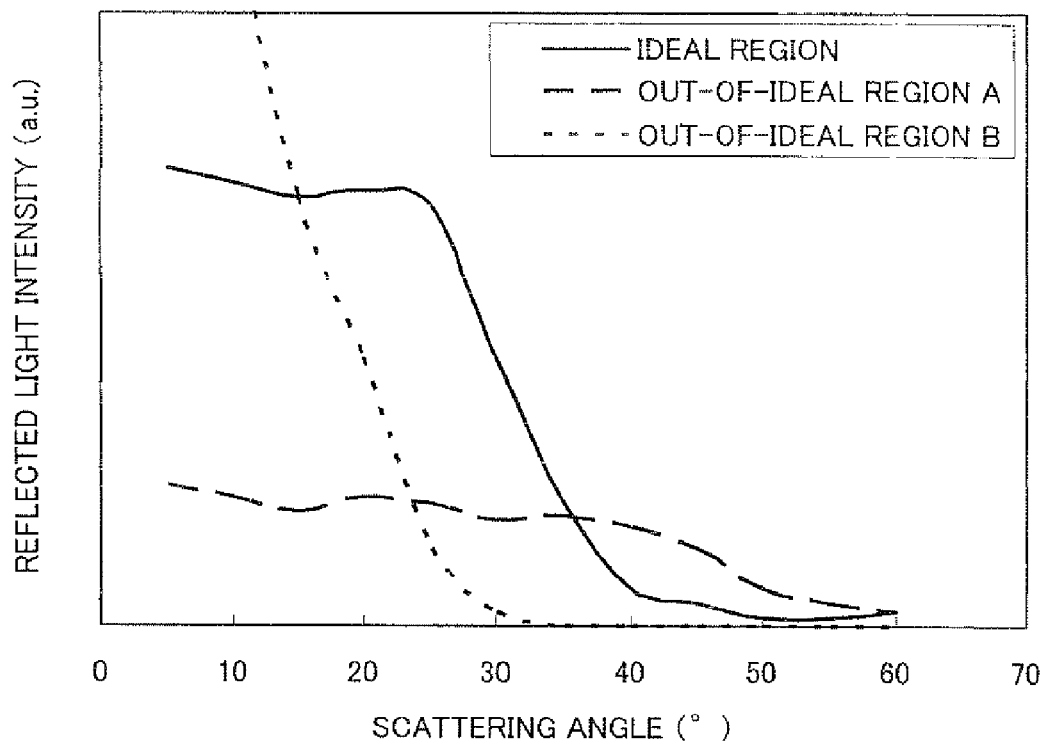
FIG. 8 is a graph showing scattering reflection characteristics of reflecting portions having tilt angle distribution in an ideal region and out-of-ideal regions A and B shown in FIG. 7.

FIG. 8 shows scattering angle reflection characteristics of each reflecting portion in the ideal region and the out-of-ideal regions A and B shown in FIG. 7. In the reflecting portion of the out-of-ideal region A, the reflecting portion has a steep corrugated profile and loss of reflected light is large. Therefore, this reflecting portion does not function sufficiently. In the reflecting portion of the out-of-ideal region B, there is no loss of reflected light, but reflected light intensity changes significantly with a change of the scattering angle. Therefore, brightness varies according to an angle of view. In other words, the advantages of forming a corrugated profile cannot be obtained in the reflecting portion of the out-of-ideal region B. In the reflecting portion of the ideal region, on the other hand, there is no loss of reflected light, and approximately the same reflection intensity is obtained even when the angle of view changes to around 30°. Therefore, this reflecting portion is considered as an ideal reflecting portion.

As can be seen from FIG. 6, it was found from the test conducted by the inventors that when the postbake process is conducted at a temperature for manufacturing a reflector having an ideal smooth corrugated profile, the height of an interlayer insulating film (a flat surface) for a transmitting portion becomes higher than the height of an interlayer insulating film (convex portions) for a reflecting portion. It was also found that the difference in level between the flat surface for the transmitting portion and the top of the convex portion in the corrugated profile for the reflecting portion needs to be at least about 1.0 μm.

Figure 13:
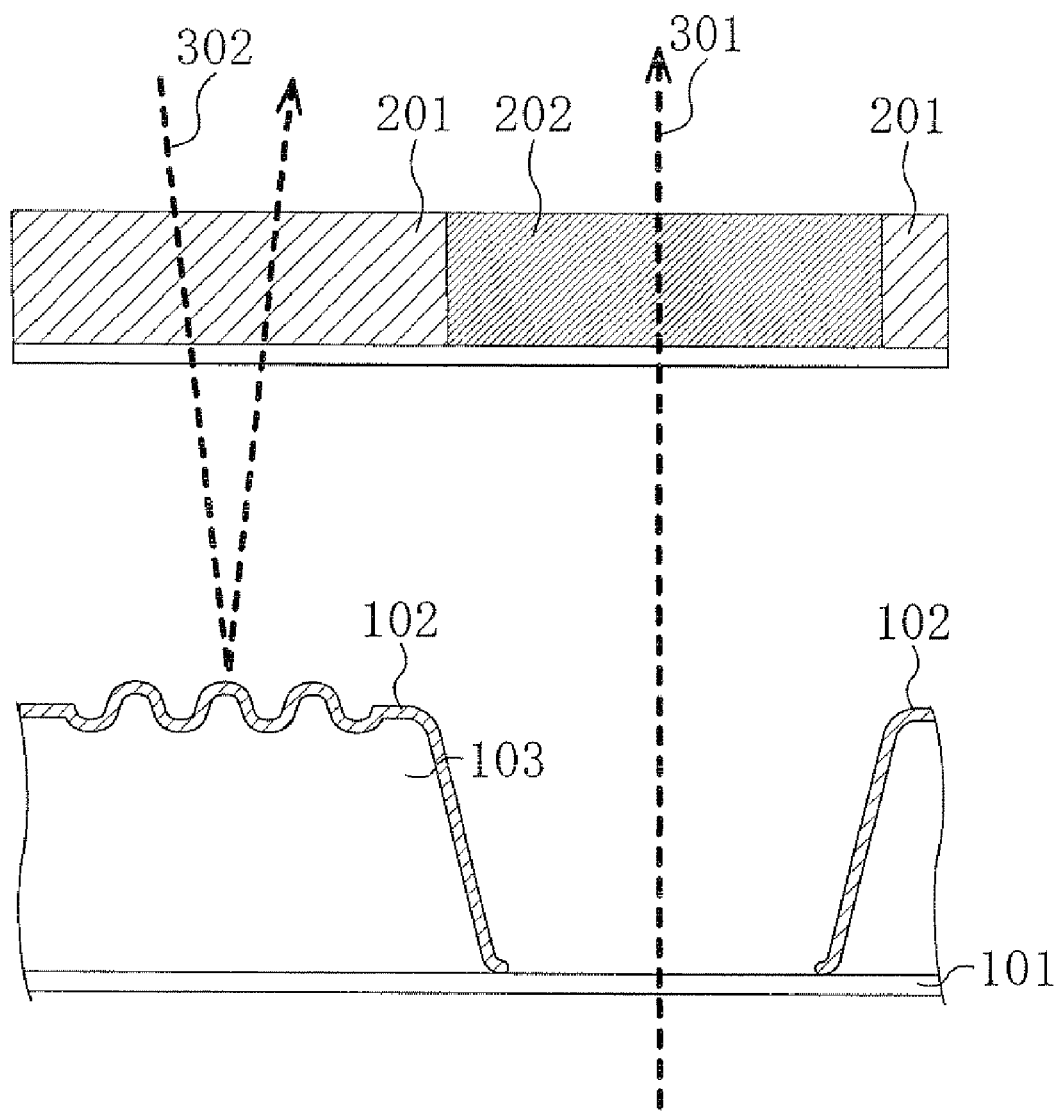
FIG. 13 is a schematic cross-sectional view of a currently widely used transflective liquid crystal display.

However, when such a corrugated profile is present in a large area of the whole reflecting portion, the same problems as those of the liquid crystal display device of FIG. 13 will arise. More specifically, when a coating material such as a color filter material is applied by a spin coating method or the like, the color filter material is deposited in the recesses of the reflecting portion and does not spread around the recesses. Therefore, the color filter material may be deposited with a large thickness in the reflecting portion or a large difference in level may be produced at the color filter surface. Moreover, a larger color filter thickness in the reflecting portion than in the transmitting portion means higher color purity in the reflecting portion than in the transmitting portion. Therefore, color design of the color filter becomes more difficult due to the relation between the respective optical path lengths of the reflecting portion and the transmitting portion in a transflective display.

The inventors then found a method for manufacturing an interlayer insulating film by using a new photomask. In other words, the inventors found a method for manufacturing an interlayer insulating film having a smooth corrugated profile for the reflecting portion and a flat profile for the transmitting portion and having substantially no difference in level between the transmitting portion and the reflecting portion.

Figure 9:
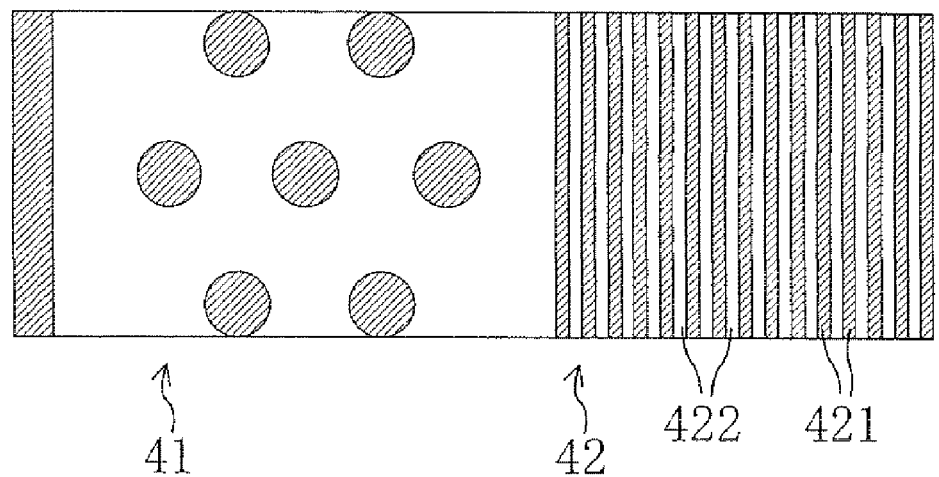
FIG. 9 is a plan view of a pattern corresponding to a single pixel in a photomask used in the first embodiment.

FIG. 9 is a plan view of a pattern corresponding to a single pixel in a photomask used in this embodiment. The photomask of FIG. 9 has a mask pattern 41 having circular light-shielding portions (with a diameter of about 5 μm) dispersed corresponding to the concave and convex portions of the reflecting portion R and a halftone exposure pattern 42 corresponding to the transmitting portion T.

A halftone exposure pattern is a technology of averagely reducing the exposure amount by causing light from an exposure system to pass through a pattern having a width or diameter smaller than the resolution of the exposure system. Accordingly, by conducting exposure and development with the halftone exposure pattern 42, the level of the flat surface in the transmitting portion T becomes lower than in the case where a light-shielding pattern is used. Moreover, since a separate mask for adjusting an excessive exposure amount is not required, manufacturing cost can be suppressed.

A commonly used stepper-type exposure system has a resolution of about 2 μm. Therefore, the halftone exposure pattern 42 is usually produced as a fine pattern of that resolution or less (e.g., about 1 μm. In this embodiment, however, a postbake process is conducted after exposure and development. Therefore, it was found that even when the surface has a somewhat uneven profile after exposure and development, the surface can be planarized by using heat sagging. Accordingly, the halftone exposure pattern 42 need not be formed as a fine pattern of about 1 µm, and a pattern having a width or diameter that is equal to or larger than the resolution of an exposure system such as a pattern having a width or diameter of 2 µm to 4 µm can be used as the halftone exposure pattern 42. Production of a photomask having a very fine pattern of about 1 µm costs several times as much as production of a mask pattern of about 2 µm. Therefore, according to this embodiment, the halftone exposure pattern technology can be used while suppressing excessive cost. As a result, manufacturing cost can be significantly reduced.

The halftone exposure pattern 42 of FIG. 9 is a slit type pattern and has light-shielding portions 421 with a width (the direction crossing the longitudinal direction) of about 3 µm and spaces (gaps) 422 with a width of about 2 µm interposed between the light-shielding portions 421 in the width direction. However, the pattern feature of the halftone exposure pattern 42 is not limited to this. For example, the halftone exposure pattern 42 may be a dot type pattern such as a rectangular or circular shape surrounded by a light-shielding portion. The halftone exposure amount can be adjusted by adjusting the proportion of the pattern size of the light-shielding portion 421 and the size of the gap 422. By using the new mask pattern of FIG. 9, am interlayer insulating film 11 having both a smooth corrugated profile and a flat profile can be manufactured by the same method as a normal halftone exposure method.

Although a positive photosensitive resin, a resin whose exposed part is developed, is used in this embodiment, a negative photosensitive resin, a resin whose unexposed part is developed, may alternatively be used. In this case, the width of the light-shielding portions 421 can be made equal to or larger than the resolution of all exposure system such as 2 µm to 4 µm.

Figure 10:
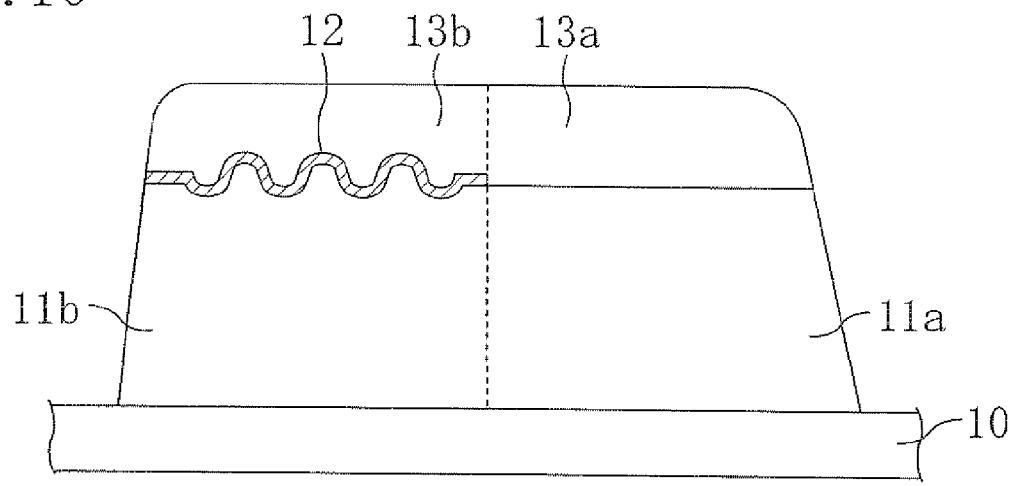
FIG. 10 schematically illustrates how a color filter 13 is applied to the interlayer insulating film 11 of the first embodiment so that the color filter 13 has approximately the same thickness in the reflecting portion R and the transmitting portion T.

Hereinafter, the step of forming the color filter 13 on the interlayer insulating film 11 according to this embodiment will be described with reference to FIGS. 10 and 11. First, a transparent electrode having a thickness of about 0.1 µm is formed on the interlayer insulating film 11*a* in the transmitting portion T, and a reflecting electrode 12 having a thickness of about 0.1 µm is formed on the interlayer insulating film 11*b* in the reflecting portion R. A photosensitive coat-type color filter 13 is applied with a thickness of about 3 µm on the interlayer insulating film 11 by a spin coating method at a rotating speed of 1,000 rpm. As shown in FIG. 10, since there is almost no difference in level of the interlayer insulating film 11 between the reflecting portion R and the transmitting portion T, the color filter 13 can be applied to the interlayer insulating film 11 so as to have approximately the same thickness in the transmitting portion T and the reflecting portion R. In other words, the color filter 13 can be applied with improved accuracy of the film thickness. It should be noted that since red, green, and blue coat-type color filter materials have different viscosities, the rotating speed of the spin coating process can be determined according to the viscosity of the color filter material.

Figure 11:
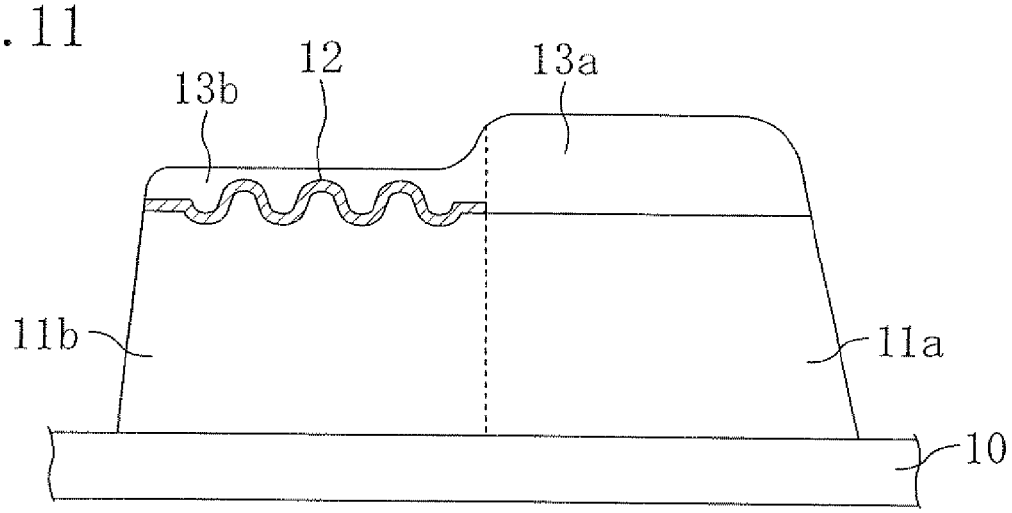
FIG. 11 schematically illustrates patterning of the color filter 13 on a counter substrate 2 of the first embodiment.

As shown in FIG. 11, the color filter 13 is patterned by adjusting the exposure amount by using the halftone exposure technology or the like. More specifically, the color filter 13 is patterned so that the color filter 13 remains only on the interlayer insulating film 11 in the reflecting portion R and the transmitting portion T and that the thickness of a color filter 13*b* in the reflecting portion R becomes approximately a half of the thickness of a color filter 13*a* in the transmitting portion T. Color tone can thus be adjusted in the color filter 13*b* of the reflecting portion R through which light passes twice and in the color filter 13*a* of the transmitting portion T through which light passes once.

In this embodiment, color adjustment is conducted by reducing the thickness of the color filter 13*b* of the reflecting portion R by half. However, color adjustment may alternatively be conducted by forming a transparent region (a white region) by patterning a part of the color filter 13*b* of the reflecting portion R.

In this embodiment, the color filter 13 is formed on the interlayer insulating film 11. However, the same effects as those obtained by forming the color filter 13 can be obtained even when another coating material is applied to the interlayer insulating film 11 by a spin coating method. For example, the thickness in the transmitting portion T and the reflecting portion R can be made approximately uniform even when an electrically conductive material such as coat-type ITO or an insulating material such as an interlayer insulating film for adjusting the liquid crystal gap and a liquid crystal alignment film is applied to the transmitting portion T and the reflecting portion R. In other words, since a coating material can be applied to the interlayer insulating film 11 having approximately the same height in the reflecting portion R and the transmitting portion T, the coating material can be applied with excellent control and a display device can be precisely designed and manufactured.

The TFT substrate 1 of this embodiment has the color filter 13. Therefore, misalignment such as bonding misalignment can be reduced even when a plastic substrate is used whose dimensions change significantly due to the temperature and water compared to a glass substrate. In other words, the CF on TFT technology capable of improving an aperture ratio can be used. Accordingly, a lightweight flexible display device having excellent flexibility can be easily and accurately manufactured. In other words, a transflective display device capable of implementing a large aperture ratio and accurate color design can be manufactured.

Second Embodiment

In the example described in the first embodiment, the height of the interlayer insulating film 11*a* in the transmitting portion T is equal to or lower than the height of the convex portion in the reflecting portion R and is equal to or higher than the height of the concave portion in the reflecting portion R. However, this invention is not limited to this structure.

Figure 12:
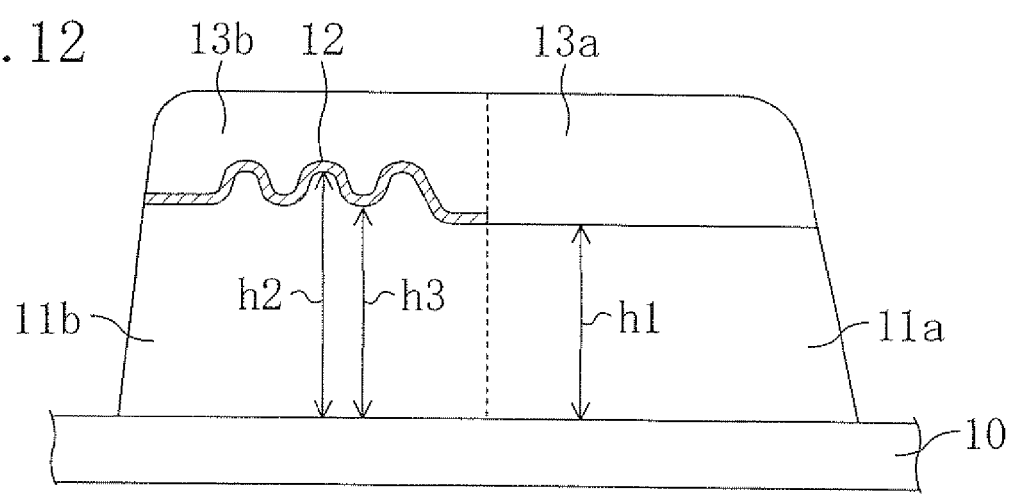
FIG. 12 is a schematic cross-sectional view of a single pixel portion of a TFT substrate 1 according to a second embodiment.

In the example described in this embodiment, the height of the interlayer insulating film 11*a* in the transmitting portion T is lower than the respective heights of the convex portion and the concave portion in the reflecting portion R. FIG. 12 is a schematic cross sectional view of a single pixel portion of a TFT substrate 1 of this embodiment. It should be noted that, in FIG. 12, the same elements as those of the TFT substrate 1 of the first embodiment are denoted with the same reference numerals and characters, and description thereof will be omitted.

In this embodiment, the thickness of the color filter 13 that is applied to the interlayer insulating film 11 is adjusted by positively using adjustment of the difference in level in the interlayer insulating film 11. More specifically, the height of the interlayer insulating film 11*a* in the transmitting portion T is intentionally made slightly lower than the height of the interlayer insulating film 11*b* in the reflecting portion R. For example, the height $h_1$ of the interlayer insulating film 11*a* in the transmitting portion T is made lower than the height $h_2$ of the convex portion in the reflecting portion R by about 1 µm. The height of the interlayer insulating film 11*a* in the transmitting portion T can be adjusted by adjusting the pattern size of the halftone exposure pattern 42 of FIG. 9 and the like. Note that the difference between the height h2 of the convex portion and the height h3 of the concave portion in the reflecting portion R is about 0.5 μm.

When a photosensitive coat-type color filter 13 is applied to the interlayer insulating film 11 by a spin coating method at a rotating speed of 1,000 rpm so that the thickness in the transmitting portion T becomes about 3 μm, the volume of the color filter 13a in the transmitting portion T is approximately twice the volume of the color filter 13b in the reflecting portion R. Accordingly, color tone of the color filter 13b in the reflecting portion R can be adjusted without patterning the color filter 13b in the reflecting portion R. In other words, color tone of the color filter 13b in the reflecting portion R can be adjusted by merely applying the color filter 13 to the interlayer insulating film 11. As a result, the manufacturing process can be simplified as compared to the first embodiment.

Although the invention has been described based on the embodiments, the technical scope of the invention is not limited to the range described in the above embodiments. It should be understood by those skilled in the art that the above embodiments are for illustration only, that various modifications can be made to combinations of the elements and the processing steps described in the embodiments, and that such modifications also fall within the scope of the invention. For example, an active matrix liquid crystal device using TFTs is described in the above embodiments. However, the invention is also applicable to an active matrix liquid crystal display device using a two-terminal element such as MIM (Metal Insulator Metal) as a switch element and a passive (multiplex) addressing liquid crystal display device.

INDUSTRIAL APPLICABILITY

The liquid crystal display substrate of the invention is applicable to a digital still camera, a cellular phone, a PDA (Personal Digital Assistance), a liquid crystal television, a notebook computer, a display of a personal computer, a display of a car navigation system, an amusement equipment such as game and pachinko, and the like.

What is claimed is:

1. A liquid crystal display substrate including a plurality of pixels having a transmitting portion and a reflecting portion, comprising:
an insulating substrate; an insulating film formed on the insulating substrate in at least the transmitting portion; a reflecting metal film on the insulating film in the reflecting portion; and a color filter formed on the insulating film in the transmitting portion and the insulating film in the reflecting portion, wherein the insulating film in at least the reflecting portion has a corrugated surface formed by concave portions and convex portions;
wherein the insulating film has a non-corrugated upper surface in the transmitting portion in a region where a transparent pixel electrode is present, and a height of the non-corrugated upper surface of the insulating film in the transmitting portion is lower than a height of convex portions of the insulating film in the reflecting portion; and
wherein the height of the insulating film in the transmitting portion is equal to or higher than a height of the concave portion of the insulating film.

2. A liquid crystal display substrate having a plurality of pixels having a transmitting portion and a reflecting portion, comprising:
an insulating substrate; an insulating film formed on the insulating substrate in the transmitting portion; a reflecting metal film directly on and contacting the insulating film in a substantial portion of the reflecting portion; and a color filter formed on the insulating film in the transmitting portion and the insulating film in the reflecting portion, wherein the insulating film in a substantial portion of the reflecting portion has a corrugated upper surface formed by concave portions and convex portions, and
wherein the insulating film has a non-corrugated upper surface in the transmitting portion in a region where a transparent pixel electrode is present, and a height of the non-corrugated upper surface of the insulating film in the transmitting portion is lower than a height of convex portions of the insulating film in the reflecting portion, and wherein respective thicknesses of the insulating film in the transmitting portion and the reflection portion are similar.

3. The liquid crystal display substrate of claim 1, wherein the reflecting film is located directly on and contacting the corrugated surface of the insulating film.

4. The liquid crystal display substrate according to claim 1, wherein the corrugated surface has 90% or higher of total presence probability of tilt angle distribution of 0° to 20° and a maximum value of the tilt angle distribution is in a range of 2° to 10°.

5. The liquid crystal display substrate according to claim 1, wherein the height of the insulating film in the transmitting portion is equal to or lower than a height of the concave portion of the insulating film.

6. The liquid crystal display substrate according to claim 1, wherein the substrate is a plastic substrate.

7. A liquid crystal display device, comprising: the liquid crystal display substrate of claim 1; a counter substrate facing the liquid crystal display substrate and having a common electrode; and a liquid crystal layer interposed between the liquid crystal display substrate and the counter substrate, wherein the transmitting portion provides display in a transmissive mode by using light entering from a side of the liquid crystal display substrate, and the reflecting portion provides display in a reflective mode by using light entering from a side of the counter substrate.

8. A method for manufacturing the liquid crystal display substrate of claim 1, comprising the steps of:
forming a photosensitive resin film on the insulating substrate;
conducting halftone exposure to the photosensitive resin film by using an exposure system and a photomask; and
forming the insulating film by heating the exposed photosensitive resin film.

9. The method according to claim 8, wherein a pattern corresponding to the transmitting portion in the photomask has a width or a diameter that is equal to or lower than resolution of the exposure system.

10. The method according to claim 8, wherein a pattern corresponding to the transmitting portion in the photomask has a width or a diameter in a range of 2 μm to 4 μm.

11. A liquid crystal display substrate including a plurality of pixels having a transmitting portion and a reflecting portion, comprising:
an insulating substrate; an insulating film formed on the insulating substrate in at least the transmitting portion; a reflecting metal film on the insulating film in the reflecting portion; and a color filter formed on the insulating film in the transmitting portion and the insulating film in the reflecting portion, wherein the insulating film in at least the reflecting portion has a corrugated surface formed by concave portions and convex portions;

wherein the insulating film has a non-corrugated upper surface in the transmitting portion in a region where a transparent pixel electrode is present, and a height of the non-corrugated upper surface of the insulating film in the transmitting portion is lower than a height of convex portions of the insulating film in the reflecting portion; and a transparent dielectric layer on the color filter formed in the reflecting portion in order to adjust a thickness of a liquid crystal layer in the reflecting portion to approximately a half of a thickness of the liquid crystal layer in the transmitting portion.

12. The liquid crystal display substrate according to claim 11, wherein the substrate is a plastic substrate.

13. A liquid crystal display device, comprising the liquid crystal display substrate of claim 11; a counter substrate facing the liquid crystal display substrate and having a common electrode; and a liquid crystal layer interposed between the liquid crystal display substrate and the counter substrate, wherein the transmitting portion provides display in a transmissive mode by using light entering from a side of the liquid crystal display substrate, and the reflecting portion provides display in a reflective mode by using light entering from a side of the counter substrate.

14. A liquid crystal display substrate including a plurality of pixels having a transmitting portion and a reflecting portion, comprising:

an insulating substrate; an insulating film formed on the insulating substrate in at least the transmitting portion; a reflecting metal film on the insulating film in the reflecting portion; and a color filter formed on the insulating film in the transmitting portion and the insulating film in the reflecting portion, wherein the insulating film in at least the reflecting portion has a corrugated surface formed by concave portions and convex portions;

wherein the insulating film has a non-corrugated upper surface in the transmitting portion in a region where a transparent pixel electrode is present, and a height of the non-corrugated upper surface of the insulating film in the transmitting portion is lower than a height of convex portions of the insulating film in the reflecting portion; and wherein the pixel electrode is provided over the reflecting film.

15. A liquid crystal display substrate including a plurality of pixels having a transmitting portion and a reflecting portion, comprising:

an insulating substrate; an insulating film formed on the insulating substrate in at least the transmitting portion; a reflecting metal film on the insulating film in the reflecting portion; and a color filter formed on the insulating film in the transmitting portion and the insulating film in the reflecting portion, wherein the insulating film in at least the reflecting portion has a corrugated surface formed by concave portions and convex portions;

wherein the insulating film has a non-corrugated upper surface in the transmitting portion in a region where a transparent pixel electrode is present, and a height of the non-corrugated upper surface of the insulating film in the transmitting portion is lower than a height of convex portions of the insulating film in the reflecting portion; and wherein the height of the insulating film in the transmitting portion is approximately equal to an average height of the convex portions and the concave portions of the insulating film.

* * * * *